(12) United States Patent
Yoon et al.

(10) Patent No.: US 11,521,954 B2
(45) Date of Patent: *Dec. 6, 2022

(54) LED ASSEMBLY HAVING VERTICALLY ALIGNED VERTICAL TYPE MICRO LED

(71) Applicants: Chi-Young Yoon, Gwangju-si (KR); Bae-Gun Jung, Seoul (KR)

(72) Inventors: Chi-Young Yoon, Gwangju-si (KR); Bae-Gun Jung, Seoul (KR)

( * ) Notice: Subject to any disclaimer, the term of this patent is extended or adjusted under 35 U.S.C. 154(b) by 111 days.

This patent is subject to a terminal disclaimer.

(21) Appl. No.: 16/849,424

(22) Filed: Apr. 15, 2020

(65) Prior Publication Data
US 2021/0098431 A1 Apr. 1, 2021

(30) Foreign Application Priority Data
Oct. 1, 2019 (KR) .......................... 10-2019-0121488

(51) Int. Cl.
*H01L 25/075* (2006.01)
*H01L 23/13* (2006.01)
(Continued)

(52) U.S. Cl.
CPC .......... *H01L 25/0753* (2013.01); *H01L 23/13* (2013.01); *H01L 33/20* (2013.01);
(Continued)

(58) Field of Classification Search
CPC ..... H01L 25/0753; H01L 23/13; H01L 33/20; H01L 33/32; H01L 33/36; H01L 33/62;
(Continued)

(56) References Cited

U.S. PATENT DOCUMENTS

2004/0223704 A1* 11/2004 Fujii .................... G02B 6/4201
385/88
2007/0224713 A1* 9/2007 Han ....................... H01L 24/95
438/26
(Continued)

FOREIGN PATENT DOCUMENTS

JP 2005-209939 A 8/2005
JP 2019-521380 A 7/2019
(Continued)

OTHER PUBLICATIONS

Korean Office Action for related KR Application No. 10-2019-0121488 dated Feb. 11, 2020 from Korean Intellectual Property Office.
(Continued)

*Primary Examiner* — Su C Kim
(74) *Attorney, Agent, or Firm* — Paratus Law Group, PLLC

(57) ABSTRACT

Disclosed is a light emitting diode (LED) assembly having vertical type micro LEDs which are vertically aligned and is capable of significantly improving light efficiency, a light quantity, and an integration degree through optimized alignment of the vertical type micro LEDs each having a nano size or micro size. The LED assembly includes a substrate provided with a plurality of through holes formed in a thickness direction, micro LEDs each formed in a vertical type in which a vertical width is greater than a lateral width, and aligned in an upright state by being at least partially inserted into the through holes, and a first electrode deposited on a lower surface of the substrate to be connected to a first conductive layer and a second electrode deposited on an upper surface of the substrate to be connected to a second conductive layer.

11 Claims, 9 Drawing Sheets

(51) Int. Cl.
*H01L 33/36* (2010.01)
*H01L 33/32* (2010.01)
*H01L 33/20* (2010.01)
*H01L 33/62* (2010.01)

(52) U.S. Cl.
CPC .............. *H01L 33/32* (2013.01); *H01L 33/36* (2013.01); *H01L 33/62* (2013.01); *H01L 2933/0066* (2013.01)

(58) Field of Classification Search
CPC ......... H01L 2933/0066; H01L 33/0008; H01L 33/0075; H01L 33/38
See application file for complete search history.

(56) References Cited

U.S. PATENT DOCUMENTS

| | | | |
|---|---|---|---|
| 2020/0185368 A1* | 6/2020 | Park | H01L 33/0093 |
| 2021/0098430 A1* | 4/2021 | Yoon | H01L 33/62 |

FOREIGN PATENT DOCUMENTS

| | | |
|---|---|---|
| KR | 10-2016-0059576 A | 5/2016 |
| KR | 10-2018-0030454 A | 3/2018 |
| KR | 10-2019-0017691 A | 2/2019 |
| WO | WO 2018/222940 A1 | 12/2018 |

OTHER PUBLICATIONS

Korean Office Action for related KR Application No. 10-2019-0121488 dated Jun. 15, 2020 from Korean Intellectual Property Office.
Korean Office Action for related KR Application No. 10-2019-0121488 dated Dec. 23, 2020 from Korean Intellectual Property Office.
Korean Notice of Allowance for related KR Application No. 10-2019-0121488 dated Apr. 27, 2021 from Korean Intellectual Property Office.

* cited by examiner

LED ASSEMBLY HAVING VERTICALLY ALIGNED VERTICAL TYPE MICRO LED

CROSS-REFERENCE TO RELATED APPLICATION

This application claims priority to Korean Patent Application No. 10-2019-0121488 (filed on Oct. 1, 2019), which is incorporated herein by reference in its entirety.

BACKGROUND

The present disclosure relates to a light emitting diode (LED) assembly, and more specifically, to an LED assembly capable of significantly improving light efficiency, a light quantity, and an integration degree through optimized alignment of vertical type micro LEDs each having a nano size or micro size.

Generally, a light emitting diode (LED) is a well-known semiconductor light emitting element which converts currents to light, and accordingly, is called the revolution of light as a green material which consumes very little energy, has a semi-permanent lifespan, and is eco-friendly due to high light conversion efficiency, and has been widely used as a light source for image display of electronic devices such as information and communication devices.

Recently, due to the development of compound semiconductor technology, high-brightness red, orange, green, blue and white LEDs have been developed, and thus applied to many fields such as traffic lights, mobile phones, automobile headlights, outdoor billboards, a liquid crystal display (LCD) back light unit (BLU), and indoor and outdoor lighting, and an active study is being performed at home and abroad. Specifically, a GaN-based compound semiconductor having a wide bandgap is a material used to manufacture an LED semiconductor which emits light of the green, blue and ultraviolet light regions, and since white LED elements can be manufactured using blue LED elements, many studies are being performed.

Among the above-described studies, a study for applying a micro LED element or the like manufactured in a nano or micro unit to lighting, displays, and the like is continuing. In this study, areas which are continuously attracting attention are electrodes capable of applying power to the micro LED element, a purpose of use, an alignment method for reducing a space occupied by the electrodes, electrode alignment, and a method of mounting a micro LED on the aligned electrodes.

The micro LED has a difficulty that it is very difficult to align freely as desired due to a size constraint. The micro LED is nano-scaled or micro-scaled, and thus cannot be manually arranged and mounted on an electrode area. However, despite the above limitations, as shown in FIG. 1, a technique of a method of laying down and aligning LEDs 30 each having a first conductive layer 31, a second conductive layer 32, and an active layer 33 on a substrate 10, on which electrodes 20a and 20b are formed, in a horizontal direction is disclosed.

However, when the LEDs 30 are aligned in the horizontal direction, since a light output direction faces toward a side surface rather than a front surface or back surface, and thus light efficiency and a light quantity are lowered, and as an area occupied by one laid LED 30 is increased, the degree of integration is reduced, and the LEDs 30 are difficult to be applied to a high resolution display. Further, since the first conductive layer 31 and the second conductive layer 32 of the LED 30 are mixed with the first conductive layer 31 and the second conductive layer 32 of the LED 30 disposed in a different column, it is difficult to connect the electrodes 20a and 20b.

Further, since the LEDs 30 are self-aligned with respect to the substrates 10 and the electrodes 20a and 20b without a structural basis by a force such as a dielectrophoretic force, accurate alignment is not achieved and an aligned state is also difficult to be stably kept.

(Patent Document 1) Korean Laid-open Patent No. 2016-0059576 (May 27, 2016)

SUMMARY

The present disclosure is directed to providing a light emitting diode (LED) assembly capable of significantly improving light efficiency, a light quantity, and an integration degree through optimized alignment of vertical type micro LEDs each having a nano size or micro size.

According to an aspect of the present disclosure, there is provided a light emitting diode (LED) assembly including: a substrate provided with a plurality of through holes formed in a thickness direction; micro LEDs each formed in a vertical type in which a vertical width is greater than a lateral width, and aligned in an upright state by being at least partially inserted into the through holes of the substrate; and a first electrode deposited on a lower surface of the substrate to be connected to a first conductive layer and a second electrode deposited on an upper surface of the substrate to be connected to a second conductive layer.

Here, alignment of the micro LEDs on the basis of the substrate may be performed by a micro LED alignment method including preparing the substrate provided with the plurality of through holes formed in the thickness direction, locating the micro LEDs to be aligned on the substrate in a state of being included in a suspension, and generating a pressure difference between an upper side and a lower side of the substrate and moving the suspension in a downward direction through the through holes of the substrate to induce the micro LEDs included in the suspension to be aligned in an upright state by being at least partially inserted into the through holes of the substrate.

Further, each of the micro LEDs may be provided so that a lower portion may have high a density in comparison with an upper portion, and thus the lower portions of the LEDs having a relatively high density may be induced to move in a downward direction in the suspension moving downward when the micro LEDs are aligned.

The micro LED may include the first conductive layer, an active layer, and the second conductive layer from a lower layer to an upper layer thereof, one of the first conductive layer and the second conductive layer may be an n-type nitride semiconductor layer, and the other one of the first conductive layer and the second conductive layer may be a p-type nitride semiconductor layer.

The micro LED may have a vertical width of 100 nm to 10 μm.

Each of the through holes of the substrate may be formed to have the same inner diameter from an upper side to a lower side thereof Each of the through holes of the substrate may include an inclined portion in which an inner diameter gradually decreases from an upper side to a lower side thereof, and the micro LED is fixed by crossing one point of the inclined portion in a state of being inserted into the through hole of the substrate.

The through holes of the substrate may be provided in various types having inner diameters of different sizes, the micro LEDs may be provided in various types having diameters of sizes corresponding to the various types of through holes, and the LEDs may be classified from large to small in size to be sequentially inserted into the through holes having diameters corresponding to the sizes when the micro LEDs are aligned by the micro LED alignment method.

Three types of through holes having inner diameters of different sizes may form one group in the substrate, and an R LED for red light emission, a G LED for green light emission, and a B LED for blue light emission may be inserted into the three types of through holes forming the one group.

The micro LED may be formed with a uniform diameter from a lower end portion to an upper end portion.

The micro LED may be formed to have a diameter which gradually increases from an upper end portion to a lower end portion.

The micro LED may be formed to have a diameter which gradually increases from a lower end portion to an upper end portion.

The micro LED may be fixed by crossing an upper inlet of the through hole of the substrate.

Meanwhile, the present disclosure includes an LED light emitting device having the above-described LED assembly.

BRIEF DESCRIPTION OF THE DRAWINGS

The above and other objects, features and advantages of the present disclosure will become more apparent to those of ordinary skill in the art by describing exemplary embodiments thereof in detail with reference to the accompanying drawings, in which.

DETAILED DESCRIPTION

Figure 1:
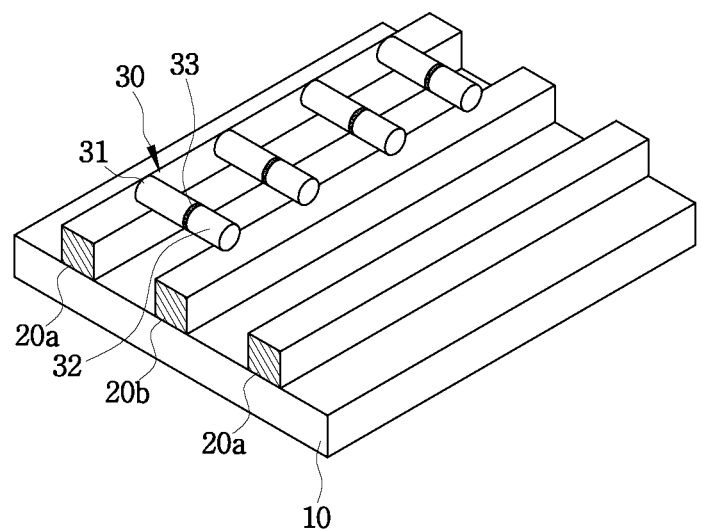
FIG. 1 is a reference diagram for describing a light emitting diode (LED) assembly according to the related art.

A light emitting diode (LED) assembly according to embodiments of the present disclosure will be described in detail with reference to the accompanying drawings. Since the present disclosure may be variously changed and have various embodiments, particular embodiments will be exemplified and described in the drawings. However, the present disclosure is not limited to the particular embodiments and includes all changes, equivalents, and substitutes within the spirit and the scope of the present disclosure. In the description of the drawings, similar reference numerals are used for similar elements. In the accompanying drawings, sizes of structures are shown to be enlarged in comparison with actual sizes for clarity of the present disclosure, or downscaled in comparison with the actual sizes to understand schematic configurations.

It should be understood that, although the terms "second," "first," and the like may be used herein to describe various elements, the elements should not be limited by the terms. The terms are only used to distinguish one element from another. For example, a first element could be termed a second element, and similarly, a second element could be termed a first element without departing from the scope of the present disclosure. Meanwhile, unless otherwise defined, all terms including technical or scientific terms used in the present disclosure have meanings which are the same as those of terms generally understood by those skilled in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiment

Figure 2:
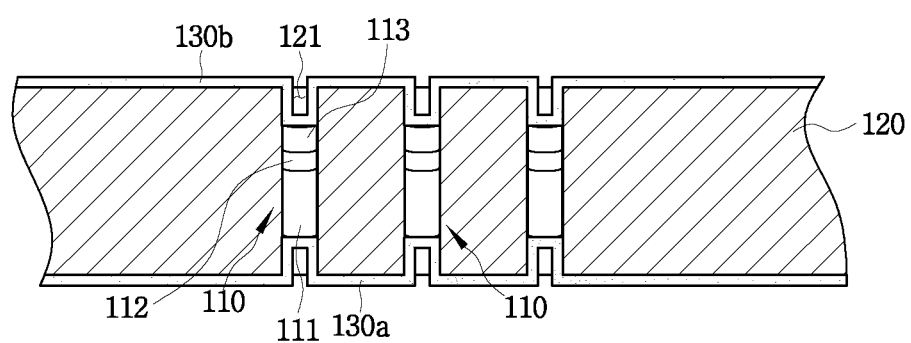
FIG. 2 is a cross-sectional view of an LED assembly according to an embodiment of the present disclosure.
Figure 3:
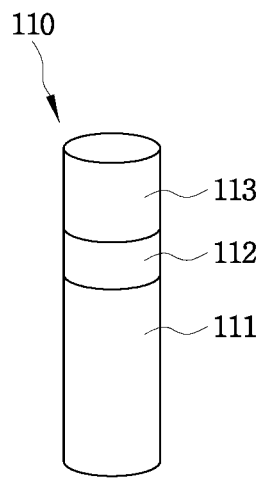
FIG. 3 is a perspective view for describing vertical type micro LEDs used in the LED assembly according to the embodiment of the present disclosure.

FIG. 2 is a cross-sectional view of an LED assembly according to an embodiment of the present disclosure, and FIG. 3 is a perspective view for describing vertical type micro LEDs used in the LED assembly according to the embodiment of the present disclosure.

As shown in the drawings, the LED assembly according to the embodiment of the present disclosure includes a substrate 120 provided with a plurality of through holes 121 formed in a thickness direction, micro LEDs 110 standing and aligned in an a state of being inserted into the through holes 121, and a first electrode 130a and a second electrode 130b respectively deposited on a lower surface and an upper surface of the substrate 120 to be connected to the micro LEDs 110.

The substrate 120 is provided to have a thickness greater than a vertical width of each of the micro LEDs 110, and the through holes 121 formed in the substrate 120 serve to fix the micro LEDs 110 in at least a partially inserted state. In order to prepare the through holes 121 in the substrate 120, one of various known methods including a super drill, laser drilling, and etching may be selected and used according to the size of a diameter. An inner diameter of the through hole 121 of the substrate 120 is determined according to a lateral width of the micro LED 110, and since the lateral width of the micro LED 110 is 100 nm to 5 µm, the diameter of the through hole 121 may be formed to be 100 nm to 5 µm. The through hole 121 of the substrate 120 may be formed to correspond to the shape and size of the micro LED 110 to support and fix the micro LED 110 in an inserted state, and as shown in FIG. 2, the substrate 120 according to the embodiment of the present disclosure has a thickness greater than the vertical width of the micro LED 110 to stably support the micro LEDs 110 in a state in which the micro LEDs 110 are completely inserted. However, the thickness of the substrate 120 may be modified to be smaller than or equal to the vertical width of the micro LED 110, and descriptions thereof will be described later in detail.

Here, the substrate 120 may be provided as a substrate formed of a transparent material such as sapphire ($Al_2O_3$) and glass, and may be selected from a material group including GaN, SiC, ZnO, Si, GaP, GaAs, and the like.

As shown in FIG. 3, the micro LED 110 may be formed in and used as a vertical type in which the vertical width is greater than the lateral width, wherein the vertical width is 100 nm to 10 µm, and the lateral width is 100 nm to 5 µm, but is not limited thereto. The micro LED 110 may be provided such that a first conductive layer 111, an active layer 112, and a second conductive layer 113 are sequentially formed from a lower layer to an upper layer, wherein the first conductive layer 111 which is an n-type nitride semiconductor layer is preferably formed of n-GaN, the active layer 112 is preferably formed of multi quantum wells (MQWs), and the second conductive layer 113 which is a p-type nitride semiconductor layer is preferably formed of p-GaN. Further, the first conductive layer 111 may be one or more selected from semiconductor materials having a composition formula of $In_xAl_yGa_{1-x-y}N$ ($0≤x≤1$, $0≤y≤1$, $0≤x+y≤1$), for example, InAlGaN, GaN, AlGaN, InGaN, AlN, InN, and the like, and may be doped with a first conductive dopant (for example, Si, Ge, Sn, or the like). The first conductive layer 111 may have a thickness of 1.5 to 5 µm but is not limited thereto. The second conductive layer 113 may be one or more selected from semiconductor materials having a composition formula of $In_xAl_yGa_{1-x-y}N$ ($0≤x≤1$, $0≤y≤1$, $0≤x+y≤1$), for example, InAlGaN, GaN, AlGaN, InGaN, AlN, InN, and the like, and may be doped with a second conductive dopant (for example, Mg). The second conductive layer 113 may have a thickness of 0.08 to 0.25 µm but is not limited thereto.

Meanwhile, the active layer 112 may be used without limitation in a case of an active layer 112 included in general micro LEDs 110 used for lighting, displays, and the like. A cladding layer doped with a conductive dopant may be formed on at least one of an upper side and a lower side of the active layer 112, and the cladding layer doped with the conductive dopant may be implemented as an AlGaN layer or InAlGaN layer. In addition, materials such as AlGaN, AlInGaN, and the like may also be used for the active layer 112. In the active layer 112, when an electric field is applied, light is generated by a combination of electron-hole pairs. A thickness of the active layer 112 may be 0.05 to 0.25 µm but is not limited thereto. The first conductive layer 111, the active layer 112, and the second conductive layer 113 described above may be included as minimum configuration elements in a light emitting structure, and at least one of different phosphor layers adjacent to each layer, the active layer 112, and a semiconductor layer may be further included.

However, the micro LED 110 is not limited to any one, and may be used by selecting micro LEDs which meet the latest technology trends.

The first electrode 130a is deposited on a lower surface of the substrate 120 to be physically and electrically connected to the first conductive layer 111 of the micro LED 110. The second electrode 130b is deposited on an upper surface of the substrate 120 to be physically and electrically connected to the second conductive layer 113 of the micro LED 110.

As described above, the LED assembly according to the embodiment of the present disclosure is a device in which the micro LEDs 110 may be vertically aligned and very stably maintain the aligned state by a completely new structure in which the micro LEDs 110 are inserted into and fixed to the through holes 121 of the substrate 120 formed in the thickness direction. Accordingly, unlike a conventional horizontal alignment method, since a problem that the first conductive layer and the second conductive layer are mixed and thus electrodes are difficult to be connected is solved and a light emitting direction is formed to be the same as a vertical direction in which the micro LEDs 110 are aligned, light efficiency may be improved. In addition, various advantages such as a case in which an integration degree of the micro LEDs 110 per the same area is significantly improved in comparison with the conventional horizontal alignment method and thus the micro LEDs 110 become very advantageous even when applied to a high resolution display, and the like may be expected.

Hereinafter, an LED assembly manufacturing method according to the embodiment of the present disclosure will be described.

Figure 4:
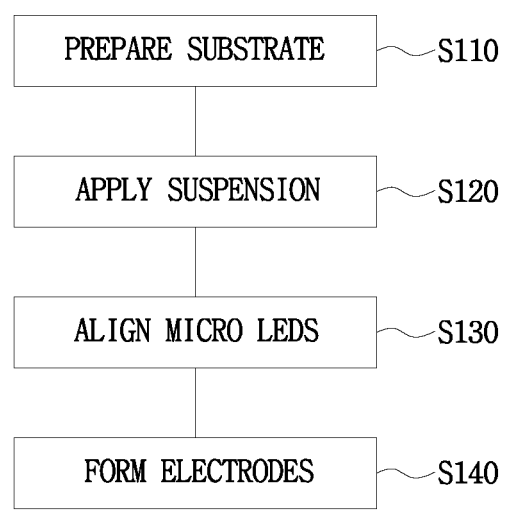
FIG. 4 is a flow chart of an LED assembly manufacturing method according to the embodiment of the present disclosure.
Figure 5:
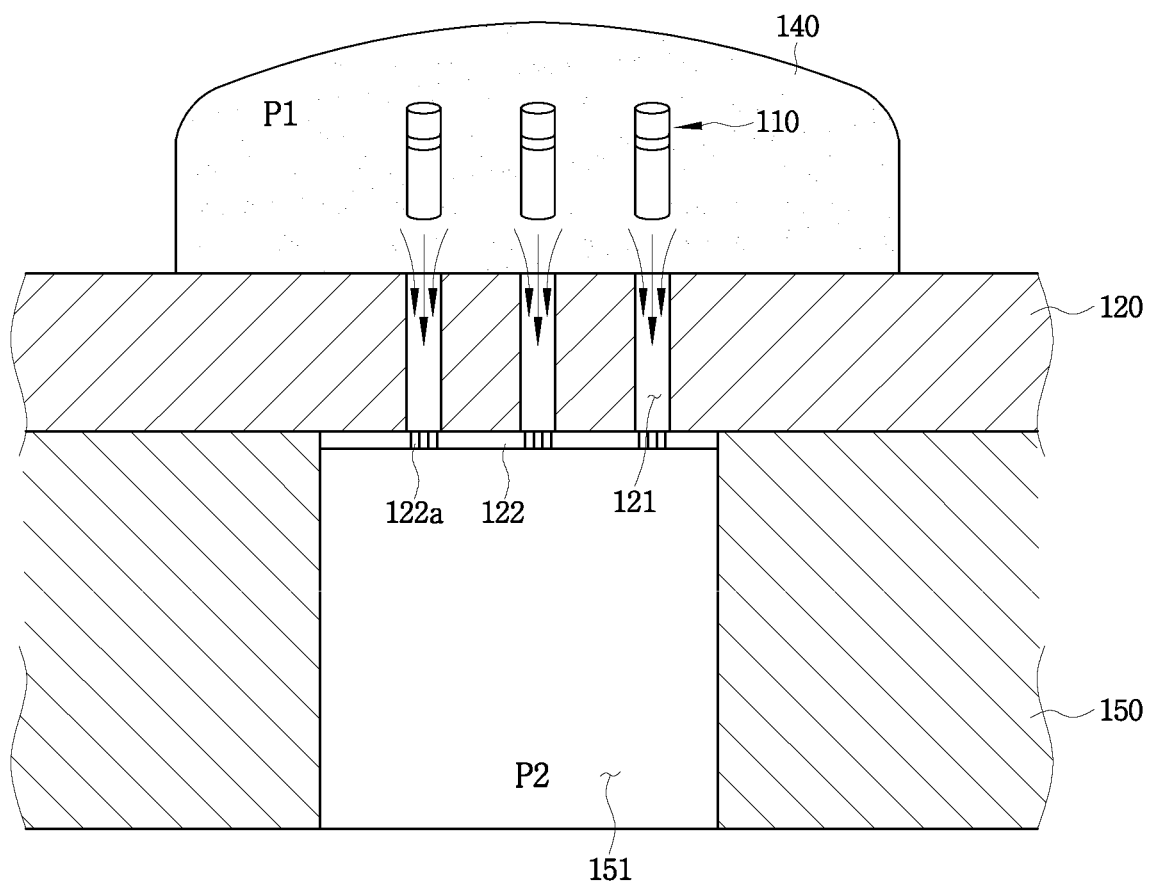
FIG. 5 is a configuration view for describing an aligning device which is used to align the micro LEDs when the LED assembly according to the embodiment of the present disclosure is manufactured.

FIG. 4 is a flow chart of an LED assembly manufacturing method according to the embodiment of the present disclosure, FIG. 5 is a configuration view for describing an aligning device which is used to align the micro LEDs when an LED assembly according to the embodiment of the present disclosure is manufactured, and FIGS. 6A to 6D are a series of reference diagrams for describing the LED assembly manufacturing method according to the embodiment of the present disclosure.

As described above, the LED assembly manufacturing method according to the embodiment of the present disclosure includes an operation of preparing a substrate (S110), an operation of applying a suspension (S120), an operation of aligning the micro LEDs (S130), and an operation of forming electrodes (S140).

In the operation of preparing the substrate (S110), a substrate 120 provided with a plurality of through holes 121 formed in a thickness direction is prepared. In order prepare the through holes 121 in the substrate 120, one of various known methods including a super drill, laser drilling, and etching is selected and used according to the size of a diameter.

Figure 6A:
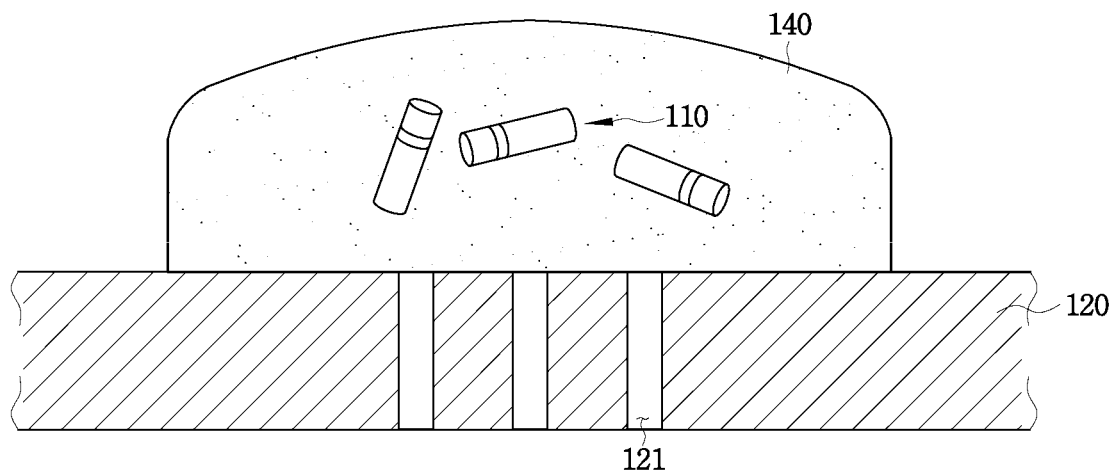
FIGS. 6A to 6D are a series of reference diagrams for describing the LED assembly manufacturing method according to the embodiment of the present disclosure.

In the operation of applying the suspension (S120), as shown in FIG. 6A, as a suspension 140 including the micro LEDs 110 to be aligned is applied on an upper surface of the substrate 120, the micro LEDs 110 are located on the substrate 120. Here, applying the suspension 140 may refer to locating the suspension 140 in a state of being brought into contact with a surface of the substrate 120, and the suspension 140 used in this case may be used without limitation to any one type when not causing a corrosion problem of the micro LEDs 110 and the substrate 120 and providing buoyancy and dispersibility to the micro LEDs 110 at an appropriate level.

Figure 6B:
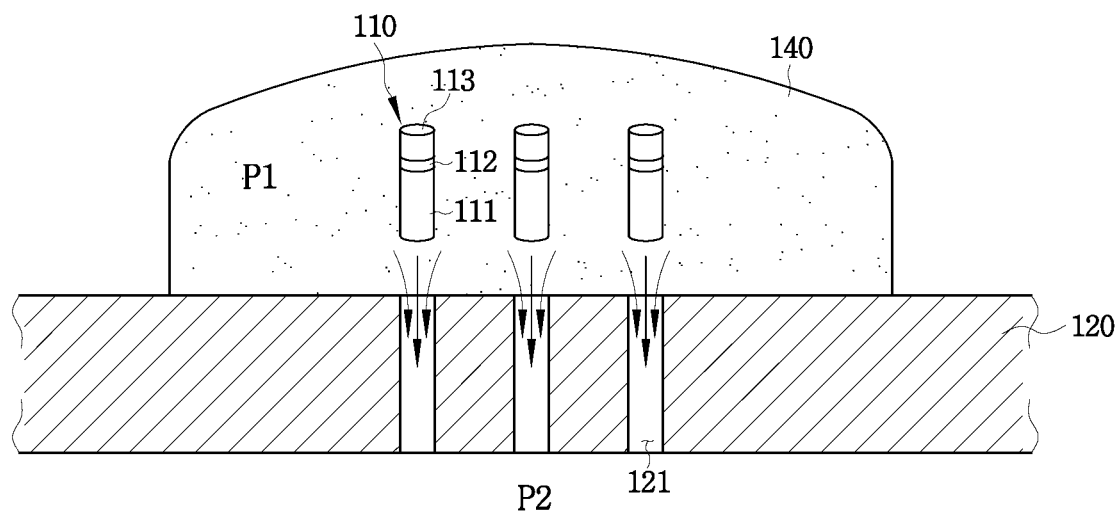
Figure 6C:
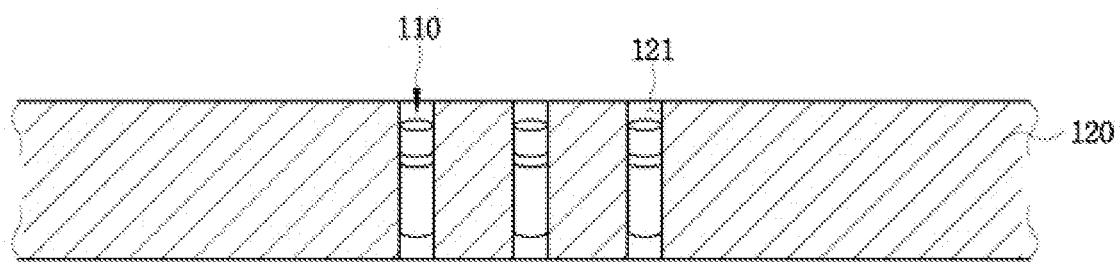

In the operation of aligning the micro LEDs (S130), as shown in FIG. 6B, a pressure difference between an upper side and a lower side of the substrate 120 is generated to move the suspension 140 in a downward direction through the through holes 121 of the substrate 120 in a state from the former operation in which the suspension 140 including the micro LEDs 110 is applied on the upper surface of the substrate 120. That is, when a pressure P2 at the lower side of the substrate 120 is formed to be smaller than a pressure P1 at the upper side of the substrate 120, since the suspension 140 located at the upper side of the substrate 120 tends to move to the lower side of the substrate 120 through the through holes 121, the suspension 140 passes through the through holes, and the micro LEDs 110 included in the suspension 140 are inserted into the through holes 121 while moving with the suspension 140.

To this end, as shown in FIG. 5, an aligning device 150 capable of imparting the pressure difference between the upper side and the lower side of the substrate 120 is needed. All devices which may form a pressure difference between the upper side and the lower side of the substrate 120 and may be precisely controlled, such as a pressure pad connected to a vacuum pump with support and having a chamber 151 to be capable of suctioning the suspension 140 from the lower side of the substrate 120 through the through holes 121 may be used as the aligning device 150.

In this case, as shown in FIG. 5, a stopper plate 122 having discharge holes 122a may be previously installed on a lower surface of the substrate 120 to allow only the suspension 140 to pass downward through the discharge holes 122a and block the micro LEDs 110 so that the micro LEDs 110 remain in the through holes 121 of the substrate 120. Alternatively, engaging protrusions which slightly protrude from lower end portions or inner circumferential surfaces, which are adjacent to the lower end portions, of the through hole 121 to serve as stoppers may be formed, and in the latter case, it may be difficult to form the engaging protrusions in the fine through holes 121. As described above, an additional member such as the stopper plate 122 may be used, and various methods such as modifying the micro LEDs 110 or the through holes 121, and the like may be used so that the micro LEDs 110 moving through the through holes 121 of the substrate 120 together with the suspension 140 do not completely pass through the through holes 121 but are stopped and fixed in the middle. Some configurations thereof will be described later.

In the operation of aligning the micro LEDs (S130), it is important that the micro LEDs 110 should have correct directivity while moving in the downward direction with the suspension 140 to be inserted into the through holes 121 of the substrate 120, and to this end, each of the micro LEDs 110 is configured to have a greater density in a lower portion in comparison with an upper portion. That is, since a lower weight of the micro LED 110 per unit area is greater than an upper weight of the micro LED 110 per unit area, in a stationary state of the suspension 140 as shown in FIG. 6A, the micro LED 110 does not show directivity in a dispersed state, but in a state in which the micro LED 110 moves in the downward direction along the suspension 140 as shown in FIG. 6B, the micro LED 110 moves in a state in which the lower portion having a greater density than other portions faces the downward direction. Since a density difference between the lower portion and the upper portion of the micro LED 110, the size of the micro LED, and the density and viscosity of the suspension 140 mainly influence how quickly or accurately the micro LED 110 is oriented with movement of the suspension 140, these specifications may be precisely adjusted.

Some aspects according to the operation of aligning the micro LEDs (S130) are described, but the most important point is realizing a unique idea for moving the suspension 140 including the micro LEDs 110 through the through holes 121 of the substrate 120 so that a plurality of micro LEDs 110 are located in the through holes 121. In addition, a point that the plurality of micro LEDs 110 are simultaneously moved in one to one correspondence to a plurality of through holes 121 to be inserted into the through holes 121 with the correct directivity to be vertically aligned and it is structurally possible to stably maintain the aligned state may be noted. Accordingly, stability may be significantly improved in comparison with a case in which the micro LEDs 110 are self-aligned by an electric field between two electrodes in a conventional horizontal alignment method. In addition, the LED assembly may be manufactured when the following process for applying power to the micro LEDs 110 proceeds.

Figure 6D:
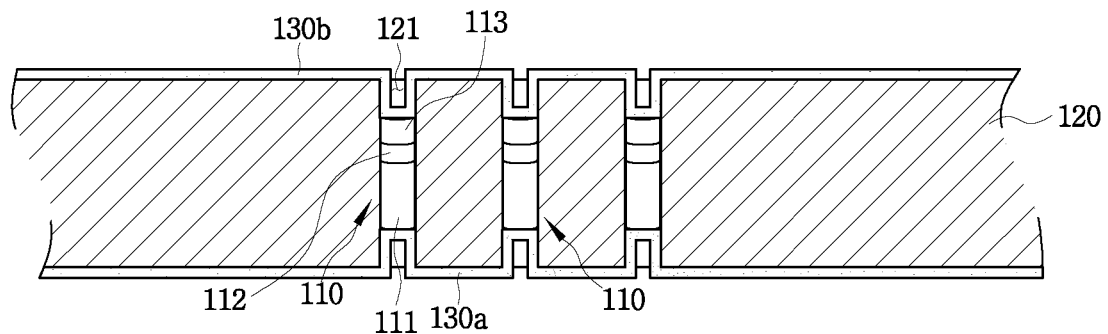

In the operation of forming the electrodes (S140), as shown in FIG. 6D, a first electrode 130a and a second electrode 130b are respectively deposited on the lower surface and the upper surface of the substrate 120, and are connected to the first conductive layers 111 and the second conductive layers 113 of the aligned micro LEDs 110 inserted into the through holes 121 of the substrate 120. Accordingly, when the power is applied to the electrodes, the micro LEDs 110 become capable of emitting light. In the operation of forming the electrodes (S140), since the plurality of micro LEDs 110 are aligned in the through holes 121 of the substrate 120 with the correct directivity through the former operations, a point that the first electrode 130a and the second electrode 130b may be easily connected to the first conductive layers 111 and the second conductive layers 113 of the micro LEDs 110 by only respectively depositing the first electrode 130a and the second electrode 130b on the lower surface and the upper surface of the substrate 120 may be noted.

Meanwhile, FIGS. 13 to 16 show that the electrodes may also be formed before the micro LEDs 110 are aligned. Specifically, as shown in the drawings, when each of the through holes 121 of the substrate 120 is formed in an inclined hole shape which becomes gradually broader from the lower side to the upper side (a modified shape will be described later), it does not require a separate stopper member such as the stopper plate 122 when the micro LEDs 110 are aligned and assists simplification of the overall process.

Various modified embodiments of the LED assembly according to the embodiment of the present disclosure are possible by a way of changing a thickness of the substrate 120 (alternatively, a length of the through hole 121) on the basis of a vertical width of the micro LED 110, or changing a shape of each of the micro LED 110 and the through hole. This will be described below.

First Modified Embodiment

Figure 7A:
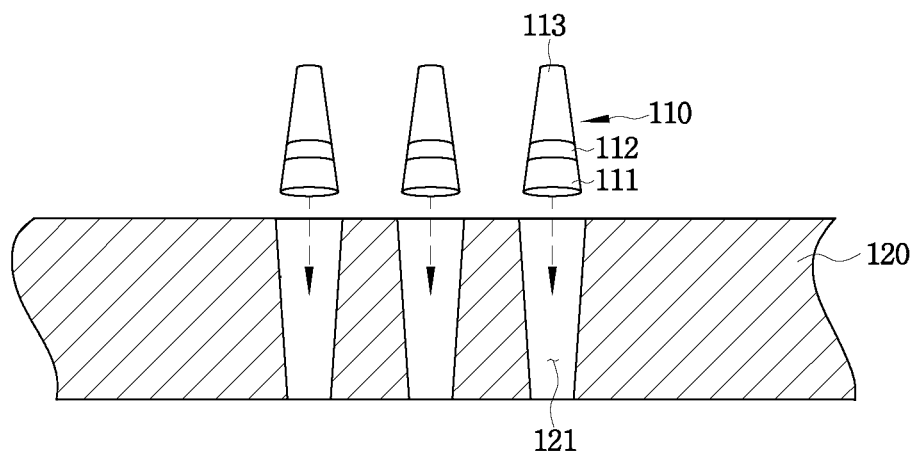
FIGS. 7A and 7B are a series of reference diagrams for describing an LED assembly according to a first modified embodiment of the present disclosure.
Figure 7B:
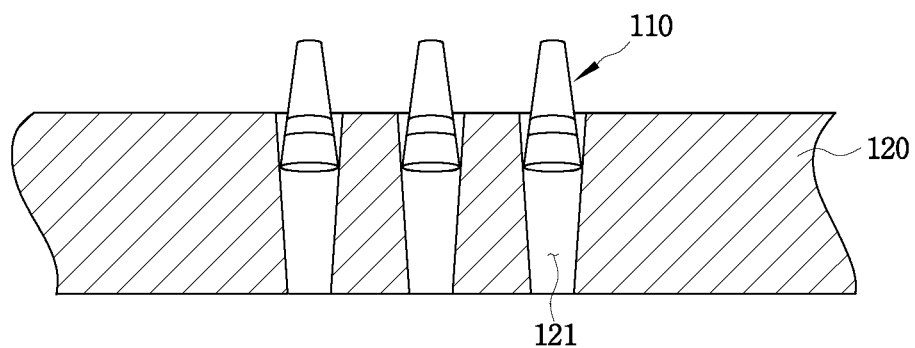

FIGS. 7A and 7B are a series of reference diagrams for describing an LED assembly according to a first modified embodiment of the present disclosure.

As described above, in the LED assembly according to the first modified embodiment of the present disclosure, in comparison with before modification, a through hole 121 of a substrate 120 is formed to have an inclined portion in which an inner diameter is not identically formed from an upper side to a lower side and gradually decreases from the upper side to the lower side, and a micro LED 110 is provided in a shape having a diameter which gradually increases from an upper end portion to a lower end portion. In the case of the micro LED 110 formed with a lower portion having a greater width than an upper portion like the above, since the lower portion of the micro LED 110 having the greater width tends to naturally move in a downward direction along a suspension 140 in an alignment process during manufacturing, it is relatively advantageous for the micro LED 110 to be correctly upright and aligned.

According to the configurations of the first modified embodiment, as shown in FIG. 7B, there is an advantage in that the lower end portion of the micro LED 110 is fixed by crossing the inclined portion of the through hole 121 of the substrate 120 even when a separate stopper member is not provided.

Second Modified Embodiment

Figure 8A:
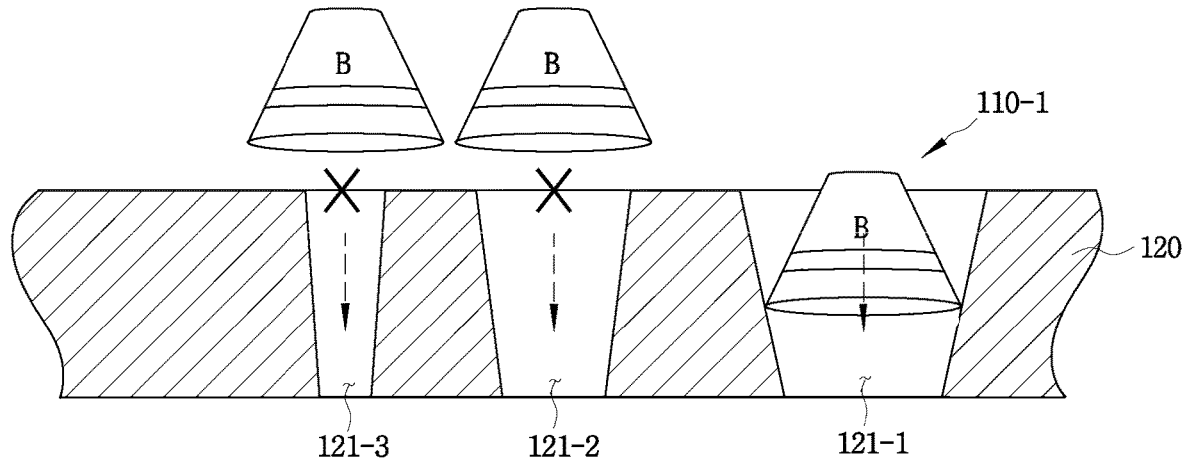
FIGS. 8A to 8C are a series of reference diagrams for describing an LED assembly and an alignment method of micro LEDs of the LED assembly according to a second modified embodiment of the present disclosure.
Figure 8B:
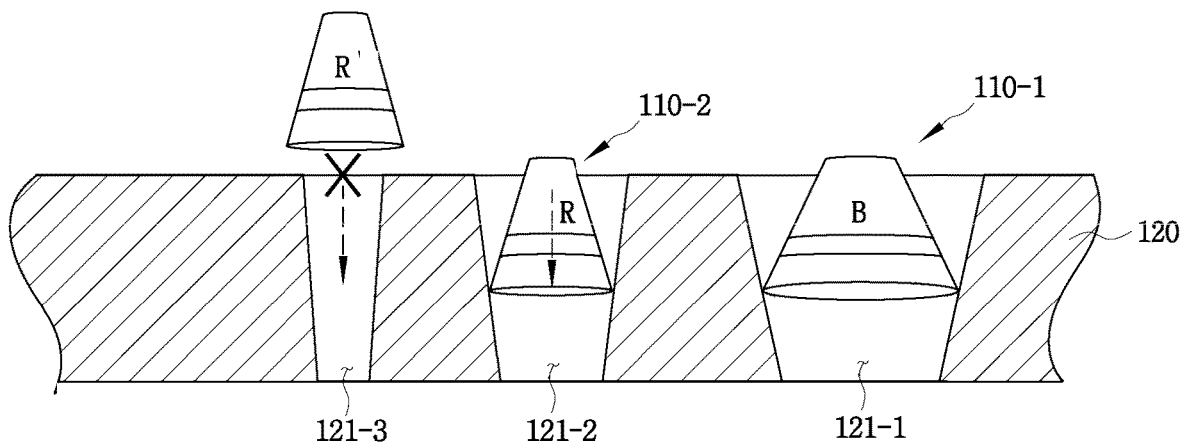
Figure 8C:
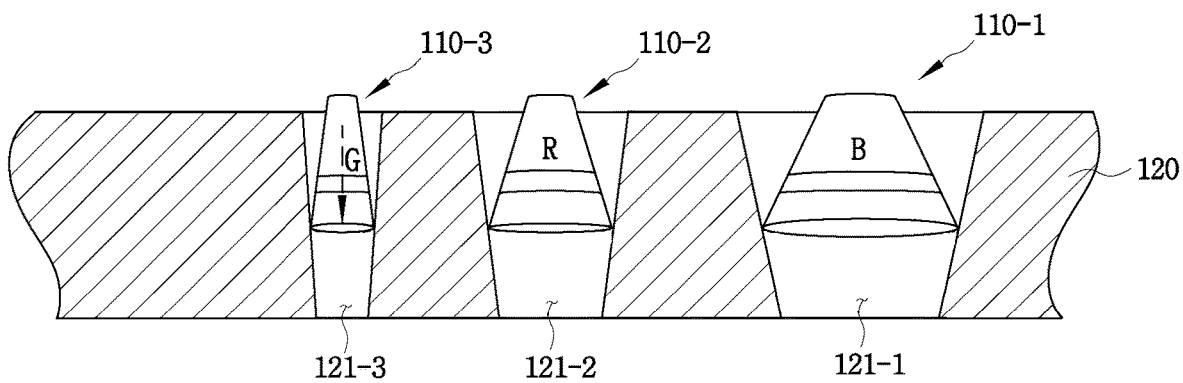

FIGS. 8A to 8C are a series of reference diagrams for describing an LED assembly and an alignment method of micro LEDs of the LED assembly according to a second modified embodiment of the present disclosure.

As shown in FIG. 8C, the LED assembly according to the second modified embodiment of the present disclosure is a form which is advanced one step further from the first modified embodiment, wherein a substrate 120 having a plurality of types of through holes having different inner diameters is provided, and micro LEDs are provided in a plurality of types having diameters of sizes corresponding to the plurality of types of through holes. In order to manufacture this type of LED assembly, a unique method in which the LEDs are classified in size from LEDs having a large diameter to the LED having a small diameter in the process of aligning the micro LEDs and are sequentially inserted into the through holes in a state of being included in a suspension 140 is used.

FIGS. 8A to 8C describes the above-described LED assembly as an example, and as shown in FIG. 8A, when each of B LEDs 110-1 for emitting blue light has the greatest diameter, first, the B LEDs 110-1 are located on the substrate 120 in a state of being included in the suspension 140, and then a pressure difference between an upper side and a lower side of the substrate 120 is generated to move the suspension 140 in a downward direction through the through holes of the substrate 120 so that the B LEDs 110-1 included in the suspension 140 are inserted into a first through hole 121-1 having the greatest inner diameter to be upright. The B LEDs 110-1 which are not inserted due to a shortage of the first through holes 121-1 among the B LEDs 110-1 included in the suspension 140 remain without being inserted into a second through hole 121-2 or third through hole 121-3 having a smaller diameter. The B LEDs 110-1 which remain without being inserted into the first through hole 121-1 are removed.

Further, as shown in FIG. 8B, each of R LEDs 110-2 for emitting red light with the second greatest diameter after the B LED 110-1 is inserted into the second through hole 121-2 corresponding to the R LED 110-2 to be upright in the same manner as above. Further, after removing the R LEDs 110-2 which remain without being inserted into the second through hole 121-2, finally, as shown in FIG. 8C, since each of G LEDs 110-3 for emitting green light with the smallest diameter is inserted into the third through hole 121-3 to be upright, alignment of the micro LEDs is completed.

Here, since adjacent three types of through holes 121-1, 121-2, and 121-3 having inner diameters of different sizes are formed as one group, the R LED 110-2, the G LED 110-3, and the B LED 110-1 form one group after the alignment is completed. However, a relative size of each of the above-mentioned R LED 110-2, G LED 110-3, and B LED 110-1 is only an example, and may be differently formed.

When applying the above-mentioned method, micro LEDs having various sizes may be disposed in various shapes.

Third Modified Embodiment

Figure 9:
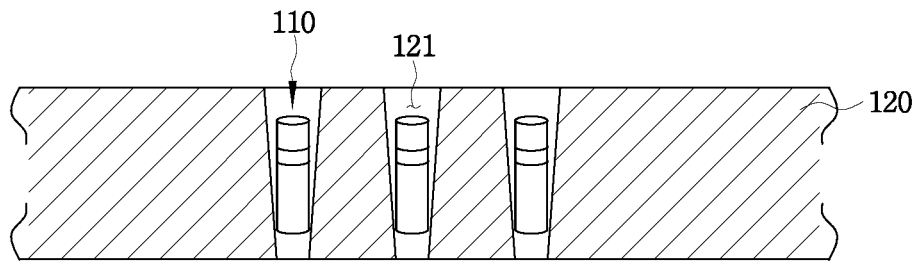
FIG. 9 is a cross-sectional view of an LED assembly according to a third modified embodiment of the present disclosure.

FIG. 9 is a cross-sectional view of an LED assembly according to a third modified embodiment of the present disclosure.

As shown in the drawing, in the LED assembly according to the third modified embodiment of the present disclosure, like the embodiment before modification, a substrate 120 has a thickness greater than a vertical width of each of micro LEDs 110 so that the micro LEDs 110 may be entirely inserted into through holes 121 of the substrate 120. However, in comparison with the embodiment before modification, the through hole 121 of the substrate 120 is formed to have an inclined portion in which an inner diameter is not identically formed from an upper side to a lower side and gradually decreases from the upper side to the lower side. Further, the micro LED 110 has a uniform diameter from a lower end portion to an upper end portion.

According to the configurations of the third modified embodiment, as shown in the drawing, there is an advantage in that the lower end portion of the micro LED 110 is fixed by crossing the inclined portion of the through hole 121 of the substrate 120 even when a separate stopper member is not provided.

Fourth Modified Embodiment

Figure 10:
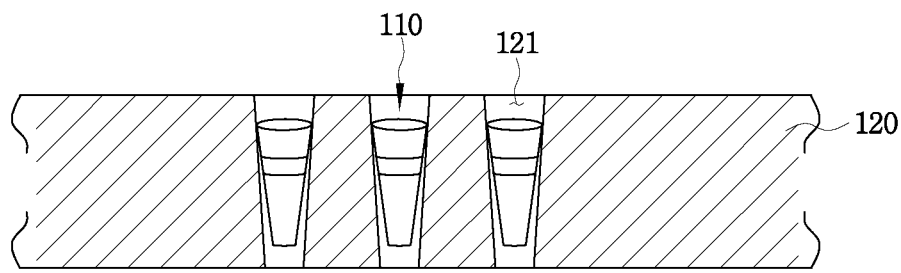
FIG. 10 is a cross-sectional view of an LED assembly according to a fourth modified embodiment of the present disclosure.

FIG. 10 is a cross-sectional view of an LED assembly according to a fourth modified embodiment of the present disclosure.

As shown in the drawing, in the LED assembly according to the fourth modified embodiment of the present disclosure, like the embodiment before modification, a substrate 120 has a thickness greater than a vertical width of each of micro LEDs 110 so that the micro LEDs 110 may be entirely inserted into through holes 121 of the substrate 120. However, in comparison with the embodiment before modification, the through hole 121 of the substrate 120 is formed to have an inclined portion in which an inner diameter is not identically formed from an upper side to a lower side and gradually decreases from the upper side to the lower side, and in addition, the micro LED 110 has a diameter which gradually increases from a lower end portion to an upper end portion.

According to the configurations of the fourth modified embodiment, as shown the drawing, there is an advantage in that the upper end portion of the micro LED 110 is fixed by crossing the inclined portion of the through hole 121 of the substrate 120 even when a separate stopper member is not provided. In the case of the fourth modified embodiment, even in comparison with the third modified embodiment, since the upper end portion of the micro LED 110 instead of the lower end portion spans the inclined portion, it can be seen that more stable supporting and fixing may be performed. However, when the micro LED 110 is formed to have a diameter which is greater at the upper portion than at the lower portion, the micro LEDs 110 may be correctly stood and aligned by applying an additional force such as a dielectrophoretic force.

Fifth Modified Embodiment

Figure 11:
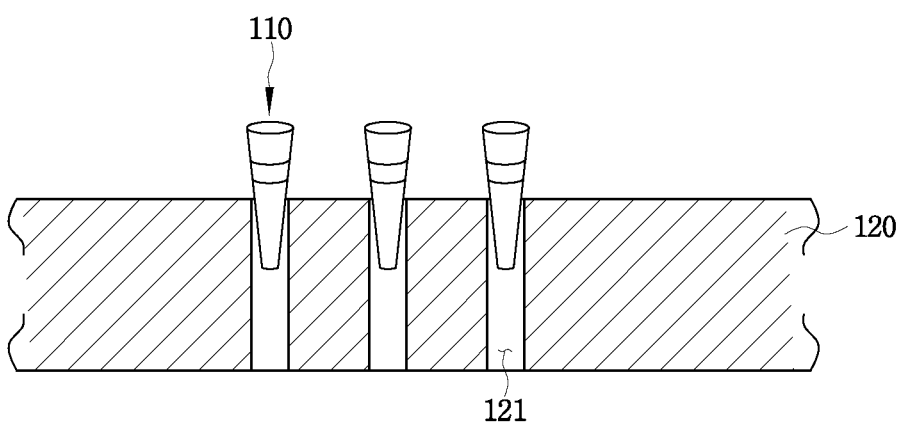
FIG. 11 is a cross-sectional view of an LED assembly according to a fifth modified embodiment of the present disclosure.

FIG. 11 is a cross-sectional view of an LED assembly according to a fifth modified embodiment of the present disclosure.

As shown in the drawing, in the LED assembly according to the fifth modified embodiment of the present disclosure, in comparison with the embodiment before modification, a micro LED 110 is provided in a shape having a diameter which gradually increases from a lower end portion to an upper end portion to be fixed by crossing an upper inlet of a through hole 121 of a substrate 120.

According to the configurations of the fifth modified embodiment, unlike the embodiment before modification, since the micro LEDs 110 are not completely inserted into the through holes 121 of the substrate 120, stability for maintaining a vertically aligned state of the micro LEDs 110 may be partially reduced, but the micro LEDs 110 may be fixed by crossing the through holes 121 of the substrate 120 even when a separate stopper member is not provided. Further, in comparison with the embodiment before modification, since a second conductive layer 113 and an active layer 112 of the micro LED 110 are exposed at an upper side of the through hole 121, a more abundant quantity of light may be emitted at an upper side of the substrate 120. Accordingly, the fifth modified embodiment may be more appropriate for application to a light emitting device which requires an abundant light quantity in comparison with the former embodiments.

Sixth Modified Embodiment

Figure 12:
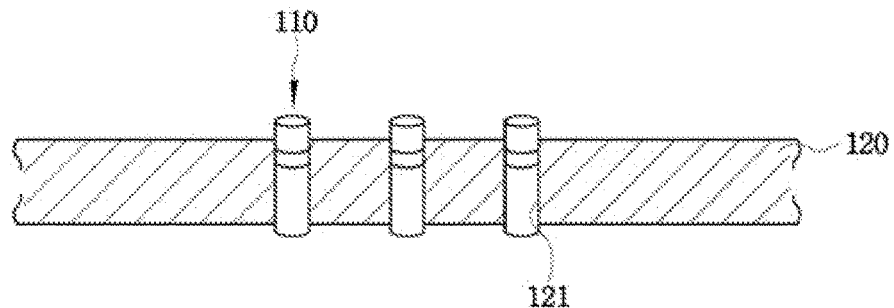
FIG. 12 is a cross-sectional view of an LED assembly according to a sixth modified embodiment of the present disclosure.
Figure 13:
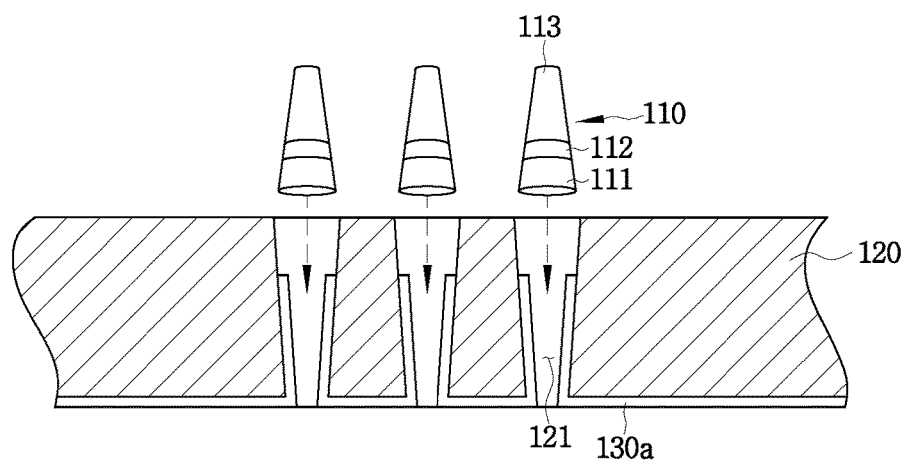
FIGS. 13 to 16 are reference diagrams for describing that a first electrode may be formed before the micro LEDs are aligned when the LED assembly according to the embodiment of the present disclosure is manufactured.
Figure 14:
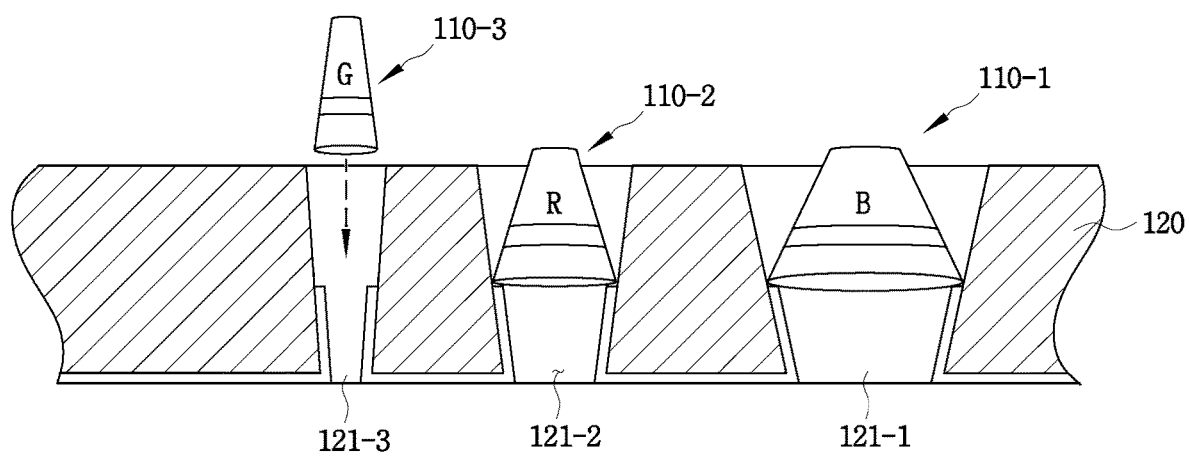
Figure 15:
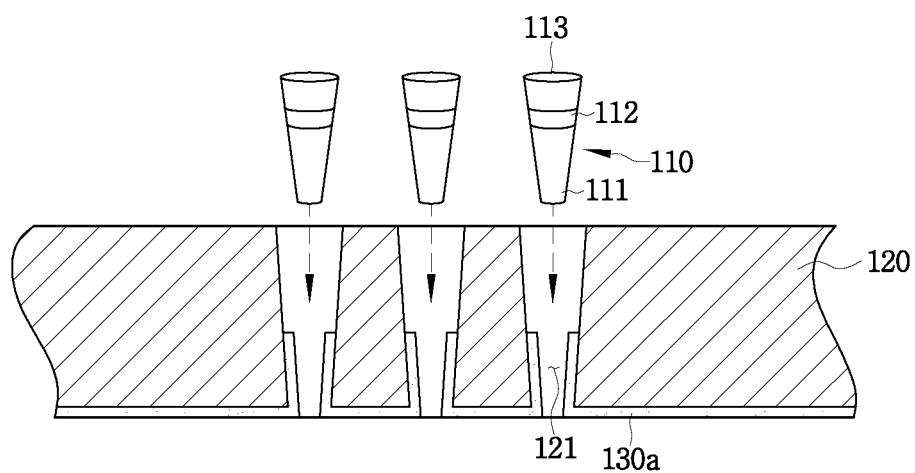
Figure 16:
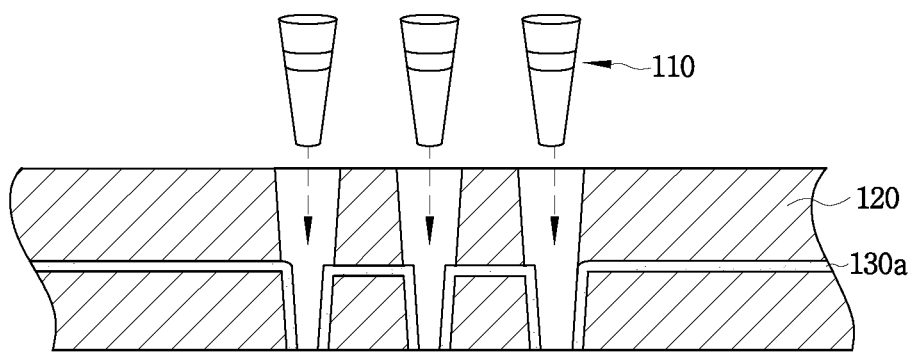

FIG. 12 is a cross-sectional view of an LED assembly according to a sixth modified embodiment of the present disclosure.

As shown in the drawing, in the LED assembly according to the sixth modified embodiment of the present disclosure, in comparison with the embodiment before modification, a substrate 120 has a thickness smaller than a vertical width of each of micro LEDs 110 so that at least one portion of an upper portion and a lower portion of the micro LED 110 partially protrudes from a through hole 121 of the substrate 120. In the case of FIG. 12, an example in which a first conductive layer 111 and a second conductive layer 113 of the micro LED 110 respectively protrude from an upper side and a lower side of the substrate 120 is described, and as described above, when the micro LED 110 protrudes from a lower side and an upper side of the substrate 120 without being inserted into the through hole 121 of the substrate 120, there is an advantage in that an abundant quantity of light may be obtained at the upper side and the lower side of the substrate 120 in comparison with the former embodiments.

In the case of FIG. 12, although the example in which the micro LED 110 protrudes from both the upper side and the lower side of the substrate 120 is described, the micro LED 110 may be biased to protrude from only the upper side of substrate 120 or only the lower side of the substrate 120. In this case, since a more abundant light quantity may be obtained only in a biased direction of the micro LED 110, the biased direction may be selected according to a light emitting device to which an LED assembly is applied.

However, when the micro LED 110 protrudes from the lower side of the substrate 120, a problem of how to stop and fix the micro LED 110 to prevent it from completely passing through and separating from the through hole 121 of the substrate 120 during a process of aligning the micro LEDs 110 using a flow of a suspension 140 is faced. In this case, the problem may be simply solved by not bringing the above-mentioned stopper plate 122 into contact with a lower surface of the substrate 120 through padding so that the stopper plate 122 and the substrate 120 may face each other with an interval therebetween, and the problem may also be solved by modifying shapes of the through hole 121 of the substrate 120 and the micro LED 110 as shown in the above-described first modified embodiment to fifth modified embodiment.

The above-described modified embodiments are modifications in a way of changing the thickness of the substrate 120 on the basis of the vertical width of the micro LED 110, and the shapes of the micro LED 110 and the through hole 121 from the embodiment before modification, and more various modifications are possible in the same manner or through partial changes and combinations of the above-described various embodiments.

An LED assembly according to the present disclosure has a structure in which a plurality of micro LEDs are uniformly and vertically aligned on the basis of through holes of a substrate by a unique vertical alignment method which moves a suspension including the micro LEDs to the through holes of the substrate, and it is possible to keep the aligned state very stable.

Further, in the present disclosure, since directions of a first conductive layer and a second conductive layer are not mixed due to the vertical alignment of the micro LEDs, the a first electrode and a second electrode corresponding to the first conductive layer and the second conductive layer are very simply formed, and since a light emitting direction is not dispersed and is concentrated in one direction, the improvement of light efficiency and an abundant light amount can be expected.

In addition, since the degree of integration of the micro LEDs per the same area is significantly improved in comparison with a horizontal alignment method, the present disclosure is advantageous for being applied to various light emitting devices, which require high quality images with an abundant light quantity, in addition to a high resolution display.

Although preferable embodiments of the present disclosure are described in the above, the present disclosure may use various changes, modifications, and equivalents. It is apparent that the embodiments may be appropriately modified to identically apply the present disclosure. Accordingly, the above-mentioned content does not limit the scope of the present disclosure determined by the limit of the claims which will be described below.

What is claimed is:
1. A light emitting diode (LED) assembly, comprising:
   a substrate provided with a plurality of through holes formed in a thickness direction;
   micro LEDs each formed in a vertical type in which a vertical width is greater than a lateral width, each including a first conductive layer and a second conductive layer at a lower layer and an upper layer, respectively, and aligned in an upright state by being at least partially inserted into the through holes of the substrate;
   a stopper plate having discharge holes and installed on a lower surface of the substrate to allow only a suspension applied on an upper surface of the substrate to pass downward through the discharge holes and block the micro LEDs included in the suspension so that the micro LEDs remain in the through holes of the substrate; and
   a first electrode deposited on the lower surface of the substrate to be connected to the first conductive layer provided at the lower layer of the micro LED and a second electrode deposited on the upper surface of the substrate to be connected to the second conductive layer provided at the upper layer of the micro LED, wherein alignment of the micro LEDs on a basis of the substrate is performed by a micro LED alignment method including preparing the substrate provided with the plurality of through holes formed in the thickness direction, locating the micro LEDs to be aligned on the substrate in a state of being included in the suspension, and generating a pressure difference between an upper side and a lower side of the substrate and moving the suspension in a downward direction through the through holes of the substrate to induce the micro LEDs included in the suspension to be aligned in an upright state by being at least partially inserted into the through holes of the substrate, and wherein each of the micro LEDs is provided so that a lower portion has a high density in comparison with an upper portion, and thus the lower portions of the LEDs having a relatively high density are induced to move in a downward direction in the suspension moving downward when the micro LEDs are aligned.

2. The LED assembly of claim 1, wherein:
the micro LED includes the first conductive layer, an active layer, and the second conductive layer from a lower layer to an upper layer thereof;
one of the first conductive layer and the second conductive layer is an n-type nitride semiconductor layer; and
the other one of the first conductive layer and the second conductive layer is a p-type nitride semiconductor layer.

3. The LED assembly of claim 2, wherein the micro LED has a vertical width of 100 nm to 10 μm.

4. The LED assembly of claim 1, wherein each of the through holes of the substrate is formed to have the same inner diameter from an upper side to a lower side thereof.

5. The LED assembly of claim 1, wherein each of the through holes of the substrate includes an inclined portion in which an inner diameter gradually decreases from an upper side to a lower side thereof, and the micro LED is fixed by crossing one point of the inclined portion in a state of being inserted into the through hole of the substrate.

6. The LED assembly of claim 1, wherein:
the through holes of the substrate are provided in various types having inner diameters of different sizes;
the micro LEDs are provided in various types having diameters of sizes corresponding to the various types of through holes; and
the LEDs are classified from large to small in size to be sequentially inserted into the through holes having diameters corresponding to the sizes when the micro LEDs are aligned by the micro LED alignment method.

7. The LED assembly of claim 6, wherein:
three types of through holes having inner diameters of different sizes form one group in the substrate; and
an R LED for red light emission, a G LED for green light emission, and a B LED for blue light emission are inserted into the three types of through holes forming the one group.

8. The LED assembly of claim 1, wherein the micro LED is formed with a uniform diameter from a lower end portion to an upper end portion.

9. The LED assembly of claim 1, wherein the micro LED is formed to have a diameter which gradually increases from an upper end portion to a lower end portion.

10. The LED assembly of claim 1, wherein the micro LED is formed to have a diameter which gradually increases from a lower end portion to an upper end portion.

11. The LED assembly of claim 10, wherein the micro LED is fixed by crossing an upper inlet of the through hole of the substrate.

* * * * *